(12) United States Patent
Le Roux (10) Patent No.: US 6,265,873 B1
(45) Date of Patent: Jul. 24, 2001

(54) NON-CPMG FAST SPIN ECHO MRI METHOD

(75) Inventor: Patrick L. Le Roux, Palaiseau (FR)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/271,629

(22) Filed: Mar. 17, 1999

(51) Int. Cl.$^7$ ............................. G01R 33/20; G01V 3/00
(52) U.S. Cl. ............................................. 324/309; 324/307
(58) Field of Search ..................................... 324/309, 307, 324/312, 318, 306, 303; 600/419

(56) References Cited

U.S. PATENT DOCUMENTS

| | | | | |
|---|---|---|---|---|
| Re. 35,656 | * | 11/1997 | Feinberg et al. | 324/309 |
| 4,720,679 | * | 1/1988 | Patrick et al. | 324/309 |
| 5,226,418 | * | 7/1993 | Bernstein et al. | 600/419 |
| 5,270,654 | * | 12/1993 | Feinberg et al. | 324/309 |
| 5,422,576 | * | 6/1995 | Kao et al. | 324/309 |
| 5,923,168 | * | 7/1999 | Zhou et al. | 324/309 |

OTHER PUBLICATIONS

*The Sensitivity of Low Flip Angle RARE Imaging*, MRM 37:176–184 (1997), D.C. Alsop.
*Reduction of Phase Error Ghosting Artifacts in Thin Slice Fast Spin–Echo Imaging*, MRM 34:632–638 (1995), Xin Wan et al.

*On the Application of Ultra–fast RARE Experiments*, MRM 27, 142–164 (1992), David G. Norris, et al.

*SPLICE:Sub–Second Diffusion–Sensitive MR Imaging Using a Modified Fast Spin–Echo Acquisition Mode*, MRM 38:638–644 (1997), Fritz Schick.

*An "Effective" Method for Generating Spin–Echo Intensity Expressions*, p. 1145, Picker International, Highland Heights OH, James B. Murdoch.

*Phase Intensitive Preparation of Single–Shot RARE: Application to Diffusion Imaging in Humans*, MRM 38:527–533 (1997), David C. Alsop.

\* cited by examiner

Primary Examiner—Christine Oda
Assistant Examiner—Tiffany A. Fetzner
(74) Attorney, Agent, or Firm—Quarles & Brady, LLP; Christian G. Cabou (57) ABSTRACT

In an MRI system a fast spin echo pulse sequence is employed to acquire data for producing an image. The phase of successive RF refocusing pulses in the sequence is shifted by a sweep factor and an odd echo signal and an even echo signal is acquired for each view. Two k-space data sets are formed, one by summing the even and odd echo signal pairs and the other by subtracting the echo signal pairs. Two magnitude images are reconstructed from the respective k-space data sets and an output image is formed by combining these two images.

9 Claims, 5 Drawing Sheets

NON-CPMG FAST SPIN ECHO MRI METHOD

BACKGROUND OF THE INVENTION

The field of the invention is nuclear magnetic resonance imaging methods and systems. More particularly, the invention relates to an improved fast spin echo pulse sequence.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant y of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The concept of acquiring NMR image data in a short time period has been known since 1977 when the echo-planar pulse sequence was proposed by Peter Mansfield (J. Phys. C.10: L55L58, 1977). In contrast to standard pulse sequences, the echo-planar pulse sequence produces a set of NMR signals for each RF excitation pulse. These NMR signals can be separately phase encoded so that an entire scan of 64 k-space lines, or "views" can be acquired in a single pulse sequence of 20 to 100 milliseconds in duration. The advantages of echo-planar imaging ("EPI") are well-known, and a number of variations on this pulse sequence are disclosed in U.S. Pat. Nos. 4,678,996; 4,733,188; 4,716,369; 4,355,282; 4,588,948 and 4,752,735. Unfortunately, even when state-of-the-art fast gradient systems are used, the EPI pulse sequence has difficulties with eddy current dependent and susceptibility induced image distortions.

A variant of the echo planar imaging method is the Rapid Acquisition Relaxation Enhanced (RARE) sequence which is described by J. Hennig et al in an article in *Magnetic Resonance in Medicine* 3,823–833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill ("CPMG") sequence, while EPI methods employ gradient recalled echoes. This fast spin echo pulse sequence ("FSE") is generally considered a problem free technique for acquiring multiple views with one excitation. It is, for instance, much less sensitive to field inhomogeneities and gradient timing errors than echo planar imaging. Further, because the readout gradient is always positive, unlike echo planar imaging, gradient fidelity is less of a problem.

However there are several critical parameters with the fast spin echo pulse sequence, which, if set incorrectly, can produce considerable image artifacts. These involve the radio frequency (RF) pulse spacing and phase relationships, and also the areas of the readout gradient pulses. Firstly, it is necessary that the time between the centers of the RF excitation pulse and first RF refocusing pulse should be half the time between the centers of adjacent refocusing pulses. Secondly, the RF phase angle between the RF excitation and RF refocusing pulses should be 90°. Related to these requirements is the fact that the area of the readout gradient pulse between the excitation and the first RF refocusing pulse should be equal to half the area of the readout gradient pulse between each of the subsequent RF refocusing pulses.

For conventional fast spin echo imaging the above critical parameters can be controlled in a relatively straight forward manner. However, there are a number of imaging situations where the required degree of phase control between the RF pulses is difficult to achieve. Two such situations are (a) diffusion weighted imaging, where large gradient pulses are employed and resulting eddy currents are more prevalent, and (b) spectral-spatial excitation for fat suppression, where precise excitation pulse phase control is required for off iso-center imaging. The difficulty is usually caused by the presence of eddy currents which induce gradient fields. Norris, et al. proposed in "On the Application of Ultra-fast RARE Experiments," *Magn. Reson. Med.*, 27, 142–164 (1992) a method for controlling the RF phase in an FSE pulse sequence which involved separating out two coherence NMR signal pathways, and using only one of the coherence NMR signals. One problem with this approach is the strong oscillation of the NMR signal amplitude which, if uncorrected, causes severe ghosting in the image. A similar idea has been proposed by Shick in "SPLICE: Sub-second Diffusion-Sensitive MR Imaging Using a Modified Fast Spin Echo Acquisition Mode," *Magn. Reson. Med.*, 38, 638–644 (1997) in which the NMR echo signal amplitude is increased. Alsop discloses in "Phase Insensitive Preparation of Single-Shot RARE: Application to Diffusion Imaging in Humans," *Magn. Reson. Med.*, 38, 527–533 (1997) a method for reducing the oscillations in the amplitude of these NMR echo signals. These methods employ crusher gradient pulses which suppress one of two NMR signal components that are normally produced in a CPMG pulse sequence. As taught by Alsop, the amplitude of the remaining component can be maintained relatively constant despite variations in phase caused by preparatory sequences such as diffusion weighting or spectral-spatial fat suppression.

However, the suppression of one CPMG signal component in these prior methods reduces the amplitude of the acquired NMR signal by one-half.

SUMMARY OF THE INVENTION

The present invention relates to an improved fast spin echo sequence, and more particularly, to a fast spin echo pulse sequence in which the phase of successive RF refocusing pulses is shifted by a phase value $\phi$, two NMR echo signals are acquired at each view with a receiver having a reference phase that is also shifted by the phase value $\phi$, and the two NMR echo signals are combined to recover two separate NMR signal components produced by the transverse magnetization. The phase value $\phi$ is chosen such that the amplitude of the combined NMR signal components is relatively constant after an initial set of echo signals are acquired.

It has been discovered that both NMR signal components produced during an FSE MRI acquisition can be acquired and combined to produce a relatively stable MRI signal. This is accomplished in part by changing the phase of the successive RF refocusing pulses and the reference phase of the MRI system receiver by a phase value $\phi$. In the preferred embodiment the phase value $\phi$ changes from echo to echo and is equal to a constant sweep factor ($\Delta$) times an echo signal index (i) squared $$\phi = \Delta i^2.$$

Another aspect of the invention is the manner in which each pair of acquired NMR echo signals are combined. One k-space data set is formed by adding each pair of acquired NMR echo signals together and a second k-space data set if formed by subtracting each pair of acquired NMR echo signals. Two magnitude images are reconstructed from the two k-space data sets and an output image is produced by using the pixel magnitude from one reconstructed image as the real component and the corresponding pixel magnitude from the other image as the imaginary component of the output image pixel signal.

GENERAL DESCRIPTION OF THE INVENTION

The NMR echo signal produced in an FSE pulse sequence is comprised of two distinct signals: one which is in phase with the original spin transverse magnetization; and a second signal which is phase negated with respect to the original spin magnetization. In mathematical terms the NMR echo signal may be expressed as follows:

$$S = DM_0 + CM_0^+ \quad (1)$$

where $M_0$ is the initial transverse magnetization and $M_0^+$ is the complex conjugate of that magnetization. The coefficients D and C vary from one echo signal to the next causing oscillations in their amplitudes. In a perfect FSE pulse sequence, however, the two coefficients tend toward the same constant value, so that after a number of initial echo signals have been produced, the signal S stabilizes:

$$D, C \to k/2 = \text{constant};$$

and $$S = k(M_0 + M_0)/2 = kM_x.$$

When perfect conditions are not achieved, as, for example, in the extreme case where the initial magnetization $M_0$ is along y, $M_0$ in equation (1) is pure imaginary $M_0 = jMy$, and the signal is:

$$S = D(jMy) + C(-jMy) = (D-C)(jMy) = (D-C)M_0.$$

In this situation the two constant signal components with coefficients C and D cancel each other out, leaving only the oscillating signal components. The constant signal part is thus null and, the resulting oscillations in echo amplitude produce artifacts in the reconstructed image.

One prior solution is to simply suppress one of the two FSE echo signal components. This is accomplished using a crusher gradient pulse and the result is a reduction in NMR signal amplitude:

$$S = k(M_0 + 0)/2 = kM_0/2. \quad (2)$$

The present invention stems from the recognition that the constants D and C oscillate in value differently and that this oscillation affects the even echo signals and odd echo signals in the FSE sequence differently. For perfect 180° refocusing pulses, D is alternately 1 at even echoes and 0 at odd echoes, whereas C follows the complimentary oscillation, 0 at even echoes and 1 at odd echoes. A first aspect of the acquisition strategy, therefore, is to separately acquire image data sets for both the odd NMR echo signals ($S_{odd}$) and the even NMR echo signals ($S_{even}$).

The practical difficulty is that perfect 180° refocusing pulses cannot always be produced and the perfect 90° phase shift between RF excitation and RF refocusing cannot always be achieved. As a result, the odd and even echo signals are not comprised solely of large, constant, C or D components, but also some other components. Another aspect of the present invention is to minimize the variation in the signals $S_{odd}$ and $S_{even}$ from one echo signal to the next, by changing the phase of the successive RF refocusing pulses in the sequence. The optimal results are achieved when the phase of successive RF refocusing pulses is advanced by an amount which is proportional to a constant sweep factor $\Delta$ times an index i squared. By convention, the index i can be made equal to one for the first RF refocusing pulse in the sequence and it increments for each RF refocusing pulse that is produced.

DESCRIPTION OF THE PREFERRED EMBODIMENT

Figure 1:
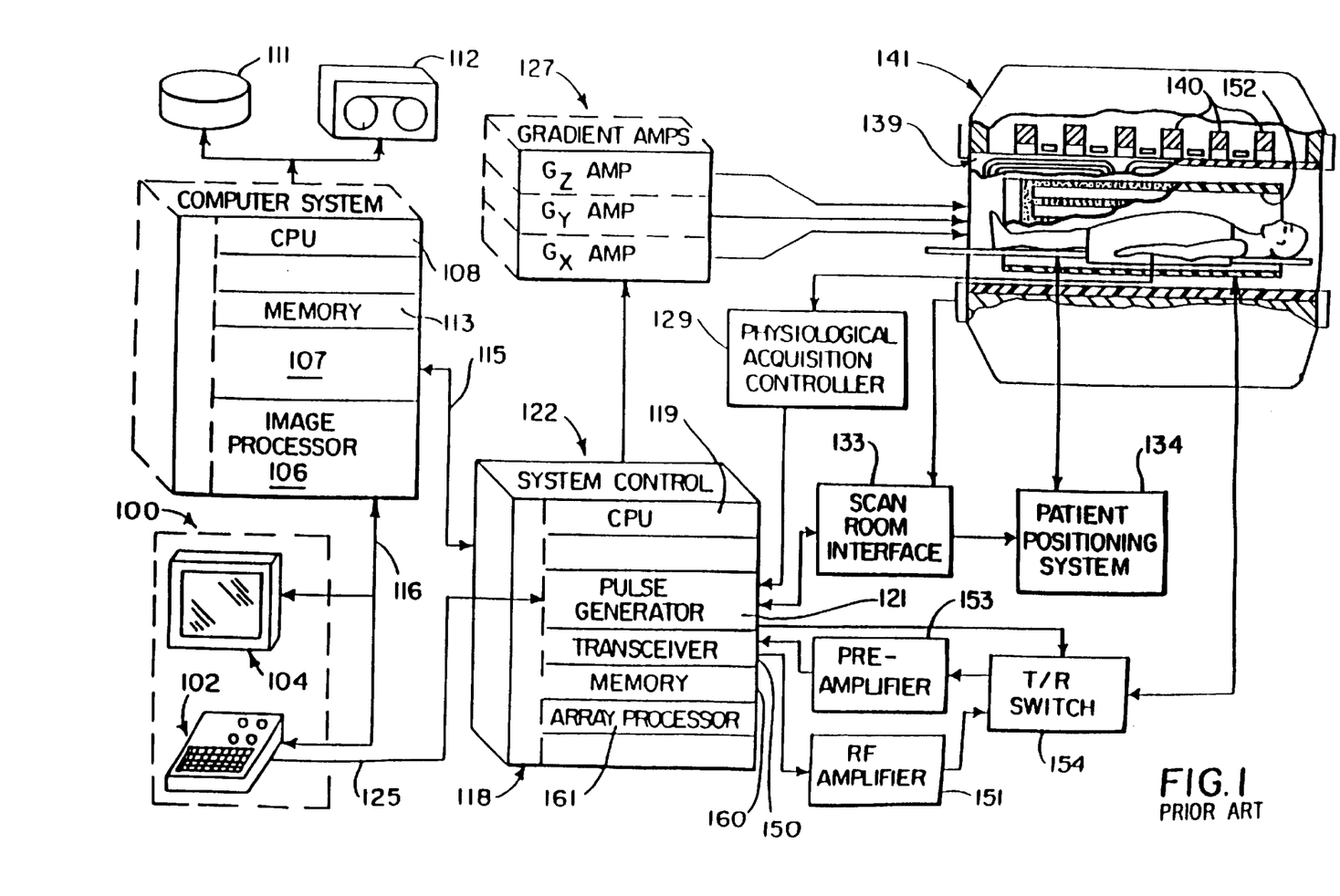
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the display 104. The computer system 107 includes a number of modules which communicate with each other through a backplane 118. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF power amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
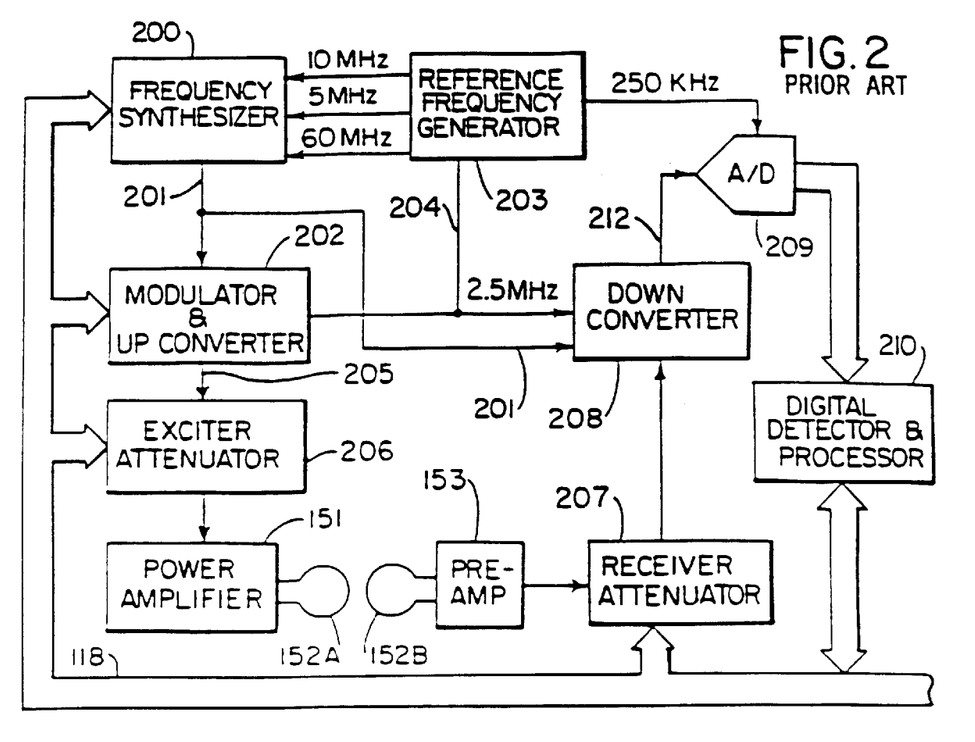
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on output 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received NMR signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. The phase of both the RF pulses produced by the transceiver module 150, and the phase of the reference signal used to down convert the received NMR signals can be precisely controlled. As will become apparent from the description below, the control of this RF phase is an important part of the fast spin echo pulse sequence of the present invention. For a more detailed description of the receiver, reference is made to U.S. Pat. No. 4,992,736 which is incorporated herein by reference.

Figure 3:
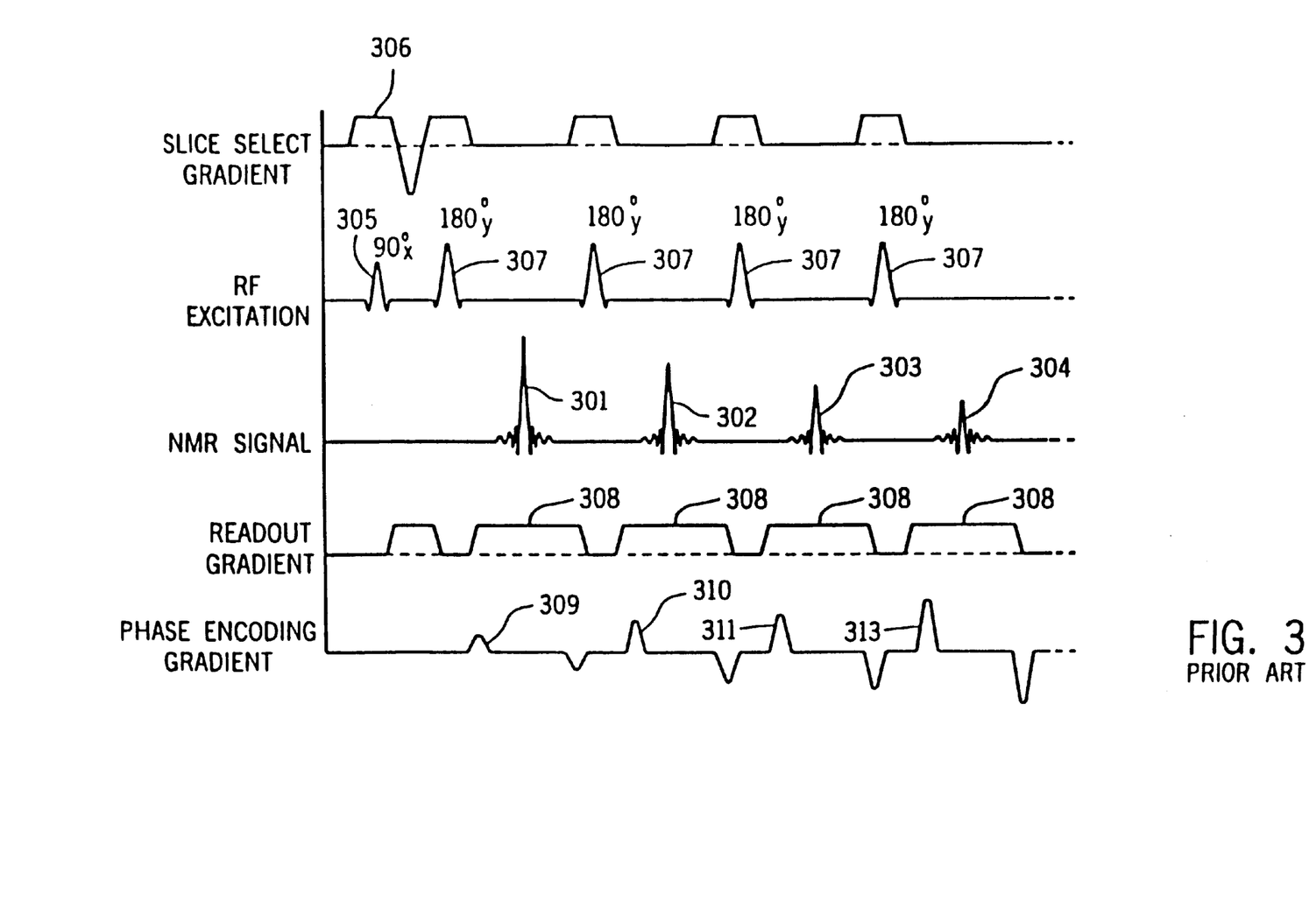
FIG. 3 is a graphic representation of a conventional fast spin echo pulse sequence.

Referring particularly to FIG. 3, a fast spin echo NMR pulse sequence, known as a 2DFT RARE sequence is shown. For clarity, only four echo signals 301–304 are shown in FIG. 3, but it can be appreciated that more are produced and acquired in each "shot". These NMR echo signals are produced by a 90° RF excitation pulse 305 which is generated in the presence of a $G_z$ slice select gradient pulse 306 to tip longitudinal magnetization and provide transverse magnetization in a slice through the patient. This transverse magnetization is refocused by each selective 180° RF refocusing pulse 307 to produce the NMR spin echo signals 301–304 that are acquired in the presence of $G_x$ readout gradient pulses 308. Each NMR spin echo signal 301–304 is separately phase encoded by respective $G_y$ phase encoding pulses 309, 310, 311 and 313. The magnitude of each phase encoding pulse is stepped through values to acquire separate views (e.g. 64, 128, or 256) during a complete scan.

As is well known to those skilled in the art, to acquire NMR echo signals of substantially constant amplitude (i.e. subject only to the normal $T_2$ decay) the phase of the RF refocusing pulses 307 is shifted 90° with respect to the phase of the RF excitation pulse 305. This is denoted in FIG. 3 by the subscript "x" on the 90° RF excitation pulse 305 and the subscript "y" on the 180° RF refocusing pulses 180°.

When the FSE pulse sequence of FIG. 3 is employed to perform a scan, a two-dimensional array of k-space data is acquired. For example, 256 NMR echo signals are acquired, each with a different phase encoding and 256 samples are acquired from each NMR echo signal to produce a 256 by 256 element k-space data set. Image reconstruction is typically performed by a two-dimensional fast Fourier transformation along the two axes of this data set and the magnitude of the signal at each image pixel location is then calculated.

Figure 4:
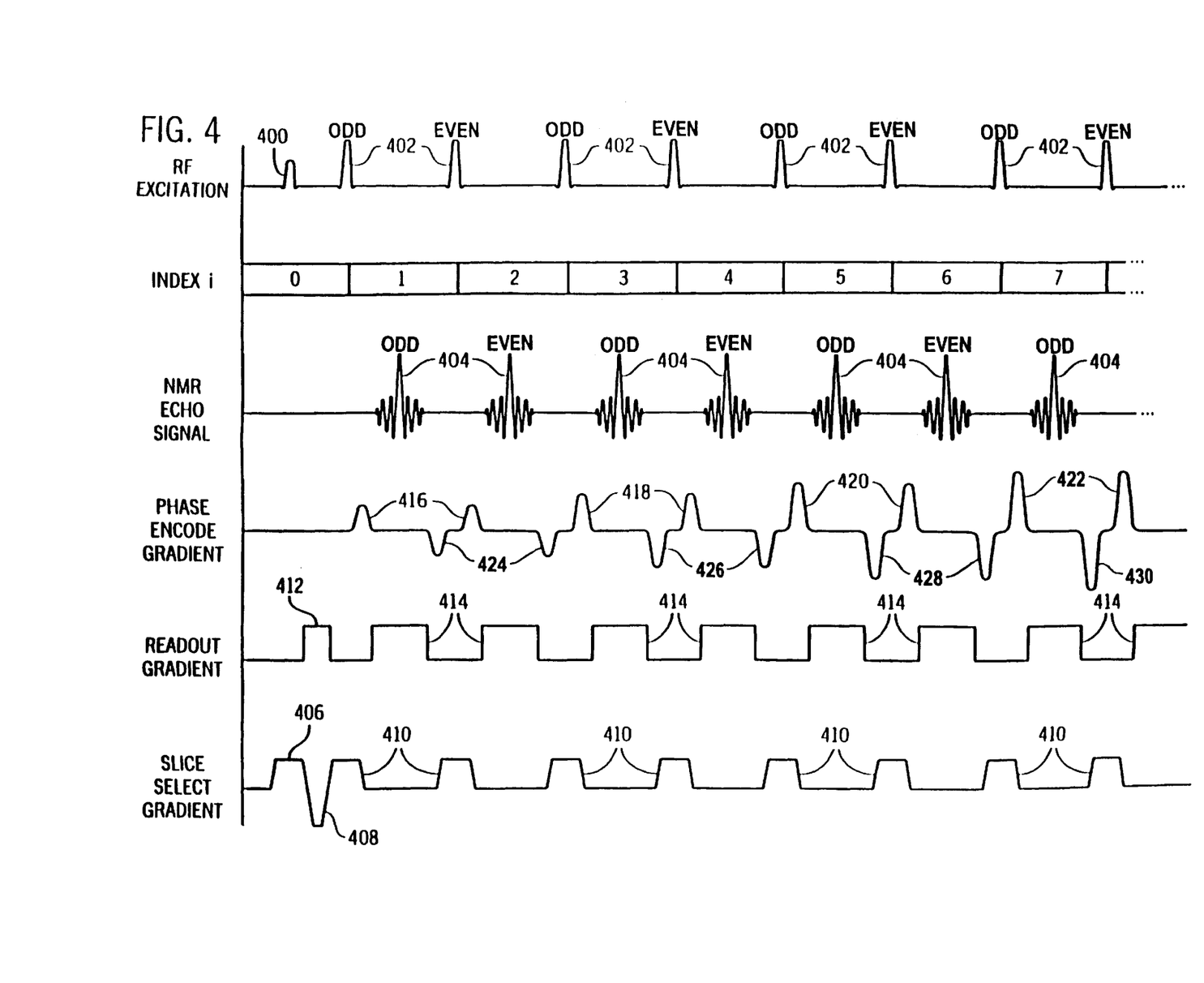
FIG. 4 is a graphic representation of the fast spin echo pulse sequence which employs the present invention.

The present invention is practiced by changing the fast spin echo pulse sequence in a number of ways to acquire two k-space data sets, and then reconstructing a single output image from these two data sets. Referring particularly to FIG. 4, the fast spin echo pulse sequence in the preferred embodiment includes an RF excitation pulse 400 followed by a series of RF refocusing pulses 402. The flip angles are preferably 90° and 180° respectively, however, other flip angles may also be employed. The RF excitation is the same as a conventional fast spin echo pulse sequence with one important difference, the phase of the RF excitation is changed in a very precise manner throughout the sequence. More particularly, the RF phase is set at an amount $\phi$ for each RF excitation, where $\phi$ increases quadratically according to the formula:

$$\phi = \Delta i^2,$$

where $\Delta$ is a sweep factor and $i$ is an index.

As shown in FIG. 4, the index $i$ defines time periods during the pulse sequence. During the first time period (i=0) the RF excitation pulse 400 is produced at a reference phase with no phase shift. Each subsequent time period (i=1, 2, 3 ... n) includes an RF refocusing pulse 402 having a phase which is shifted by the amount $\phi$ from the reference phase. In the preferred embodiment the sweep factor $\Delta$ is set to $(10/49)2_o$ radians or 73.47°.

As with a conventional FSE pulse sequence, the RF excitation is performed in the presence of a slice select gradient to excite and refocus spins in a slice through the subject. A slice select gradient pulse 406 and rephasing gradient pulse 408 cooperate with the RF excitation pulse 400 to produce transverse magnetization in the selected slice, and slice select gradient pulses 410 cooperate with respective refocusing RF pulses 402 to invert the transverse magnetization in the selected slice.

The RF refocusing pulses 402 each produce a corresponding NMR echo signal 404 that is acquired in the presence of a readout gradient 414. The NMR echo signals 404 are centered midway between RF refocusing pulses 402 and each is located in the same time period $i$ as the RF refocusing pulse 402 that precedes it. The receiver reference phase during each reception period is set such that the emission axis of the RF pulse at period $i$ bisects the receiving phase axis at period $i-1$ and the receiving phase axis at period $i$, with the convention that the receiving phase axis during the period $i=0$ (RF excitation pulse 400) is zero. As with a conventional FSE pulse sequence, the readout gradient is comprised of a dephasing pulse 412 which is applied before the first refocusing RF pulse 402, and a series of readout gradient pulses 414 applied concurrently with the respective NMR echo signals 404. The dephasing gradient pulse 412 is precisely one-half the size of the readout gradient pulses 414.

A phase encoding gradient is stepped through a series of values to acquire a corresponding series of views. Unlike a conventional FSE pulse sequence, however, two NMR echo signals are acquired at each phase encoding—an odd echo signal and an even echo signal. As shown in FIG. 4, the same phase encoding pulse 416 is applied before the respective first and second NMR echo signals 404 (which together form a pair of odd and even NMR echo signals as shown), a different phase encoding pulse 418 is applied before the next two NMR echo signals 404, a third value is applied by phase encoding pulses 420 before the next two NMR echo signals 404, and a fourth value is applied by phase encoding pulses 422 before the next two NMR echo signals 404 (only the first of which is shown). Consequently, an "even" echo signal 404 is acquired at each phase encoding value used during the scan and a corresponding set of "odd" echo signals 404 are acquired. These two sets of acquired NMR echo signals 404 form two k-space data sets $S_{odd}$ and $S_{even}$. As is well known in the art, rewinder gradient pulses 424, 426, 428 and 430 corresponding to the phase encoding pulses 416, 418, 420 and 422, respectively, are applied after each echo signal 404 is acquired.

A complete scan may be performed with a single pulse sequence, or the k-space data sets $S_{odd}$ and $S_{even}$ may be acquired in a series of pulse sequences. If the data is acquired in separate "shots", the same pulse sequence is used for each shot, but the phase encoding is changed to acquired different views. For example, 64 views may be acquired for each data set $S_{odd}$ and $S_{even}$ with 4 shots each acquiring 16 odd echo signals and 16 even echo signals being used. In the preferred embodiment only one-half of k-space is sampled.

Figure 5:
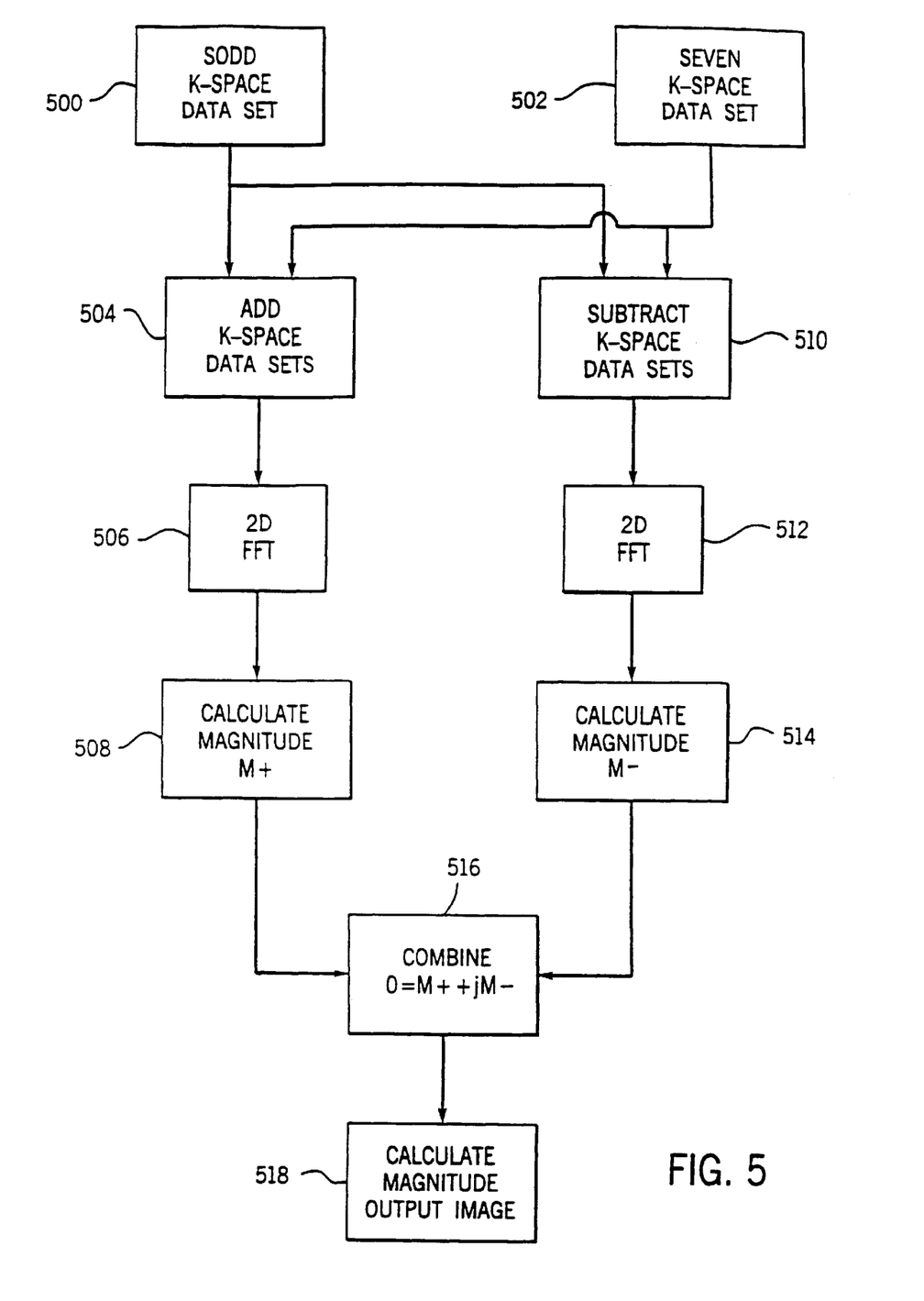
FIG. 5 is a pictorial illustration of the method employed to produce an image from the data acquired using the pulse sequence of FIG. 4.

Referring particularly to FIG. 5, after the scan is completed and the two k-space data sets $S_{odd}$ and $S_{even}$ are stored, an output image is reconstructed by the computer system 107. The corresponding I and Q values of each element in the two k-space data sets 500 and 502 are added together as indicated at process block 504, and a two-dimensional fast Fourier transformation is performed on the resulting "sum" k-space data set as indicated at process block 506. A magnitude image (M+) is produced at process block 508 by calculating the square root of the sum of the squares of the I and Q values in the resulting image.

A second magnitude image (M−) is also produced from the acquired k-space data sets 500 and 502. As indicated at process block 510, the first step is to subtract corresponding I and Q values in each element of the k-space data sets 500 and 502 to produce a "difference" k-space data set. A two-dimensional fast Fourier transformation is performed on this difference k-space data set as indicated at process block 512, and a magnitude image M– is calculated at process block 514 from the I and Q values in the resulting difference image.

The output image is produced by combining the sum and difference magnitude images M+ and M–. As indicated at process block 516, this is done by mapping the magnitude values in the image M+ to the corresponding real elements (I) in the output image (O), and mapping the magnitude values in the image M– to the corresponding imaginary elements (Q) in the output image (O). The resulting output image (O) is an array of complex values which indicate the NMR signal intensity and phase at each voxel in the selected slice. As indicated at process block 518, a magnitude image may be calculated from the I and Q values at each image voxel and used to control the brightness of the corresponding image pixel.

What is claimed is:

1. A method for producing an image with an MRI system, the steps comprising:
   a) producing transverse magnetization in a region of interest by producing an RF excitation pulse at a reference phase;
   b) producing a series of RF refocusing pulses at regular intervals following step a), wherein the phase of successive RF refocusing pulses is advanced with respect to the reference phase by an amount φ which increases as the function of a sweep factor Δ and the square of an index i, and wherein the series of RF refocusing pulses includes a first subseries of odd numbered RF refocusing pulses alternating with a second subseries of even numbered RF refocusing pulses, so that the series of RF refocusing pulses includes successive pairs of the odd and even numbered RF refocusing pulses;
   c) acquiring a first set of NMR echo signals respectively occurring after the odd numbered RF refocusing pulses and storing the acquired data in a $S_{odd}$ k-space data set;
   d) acquiring a second set of NMR echo signals respectively occurring after the even numbered RF refocusing pulses and storing the acquired data in a $S_{even}$ k-space data set; and
   e) reconstructing an image by Fourier transforming and combining both k-space data sets.

2. The method as recited in claim 1 which includes producing a phase encoding gradient pulse following each RF refocusing pulse and the phase encoding gradient pulses are stepped through a series of values to phase encode the first set of acquired NMR echo signals, and are stepped through the same series of values to phase encode the second set of acquired NMR echo signals, such that the even and odd RF refocusing pulses of each of the pairs are followed by phase encoding gradient pulses of the same value.

3. The method as recited in claim 1 in which step e) includes:
   i) summing the two k-space data sets;
   ii) Fourier transforming the result of step i) to produce a sum image;
   iii) calculating the difference between the two k-space data sets;
   iv) Fourier transforming the result of step iii) to produce a difference image;
   v) combining the sum and difference images to produce an output image.

4. The method as recited in claim 3 in which step v) includes:
   calculating a magnitude image M+ from the sum image;
   calculating a magnitude image M– from the difference image; and
   mapping elements of the M+ magnitude image to corresponding real elements in the output image and mapping elements of the M– magnitude image to corresponding imaginary elements in the output image.

5. The method as recited in claim 1 in which the sweep factor Δ is substantially 10/49 of a complete phase cycle.

6. The method as recited in claim 1 in which the index i corresponds to the number of RF refocusing pulses produced during the production of the series of RF refocusing pulses.

7. An MRI system which comprises:
   first means for producing a polarizing magnetic field;
   second means for producing an RF magnetic field;
   third means for producing magnetic field gradients;
   pulse generator means for operating the first, second and third means to perform a fast spin echo pulse sequence in which a series of RF refocusing pulses are produced at regular intervals and a series of NMR echo signals are produced by a subject being imaged, wherein the phase of successive RF refocusing pulses is advanced with respect to a reference phase, and wherein the series of NMR echo signals includes a first subseries of odd numbered NMR echo pulses alternating with a second subseries of even numbered NMR echo pulses;
   receiver means for acquiring the NMR echo signals and storing the odd numbered NMR echo signals in said series in a first k-space data set and storing the even numbered NMR echo signals in said series in a second k-space data set; and
   calculation means for reconstructing an output image by Fourier transforming and combining the first and second k-space data sets.

8. The MRI system as recited in claim 7 in which the calculation means includes:
   means for summing the first and second k-space data sets to produce a sum k-space data set;
   means for Fourier transforming the sum k-space data set and producing a magnitude image $M^+$;
   means for subtracting the first and second k-space data sets to produce a difference k-space data set;
   means for Fourier transforming the difference k-space data set and producing a magnitude image $M^-$; and
   means for combining the two magnitude images $M^+$ and $M^-$ to form the output image.

9. The MRI system as recited in claim 7 in which the fast spin echo pulse sequence includes a series of RF refocusing pulses produced by the second means and the phase of successive RF refocusing pulses produced by the second means is advanced by an amount φ which increases as the function of a sweep factor Δ and the square of an index i.

* * * * *